(12) United States Patent
Schwarz et al.

(10) Patent No.: US 11,561,285 B2
(45) Date of Patent: Jan. 24, 2023

(54) TRANSMITTING UNIT AND LIDAR DEVICE USING AT LEAST TWO RADIATION SOURCES HAVING AT LEAST ONE OF A SETTABLE OPERATING TEMPERATURE AND A SETTABLE EMISSION WAVELENGTH TO GENERATE AND EMIT PUNCTIFORM OR LINEAR ELECTROMAGNETIC BEAMS FOR SCANNING A SCANNING RANGE

(71) Applicant: Robert Bosch GmbH, Stuttgart (DE)

(72) Inventors: Hans-Jochen Schwarz, Stuttgart (DE); Klaus Stoppel, Mundelsheim (DE); Martin Roland Strohhaecker, Korntal (DE); Stefan Spiessberger, Weinstadt (DE)

(73) Assignee: Robert Bosch GmbH, Stuttgart (DE)

( * ) Notice: Subject to any disclaimer, the term of this patent is extended or adjusted under 35 U.S.C. 154(b) by 1007 days.

(21) Appl. No.: 16/263,771

(22) Filed: Jan. 31, 2019

(65) Prior Publication Data
US 2019/0235059 A1 Aug. 1, 2019

(30) Foreign Application Priority Data
Feb. 1, 2018 (DE) .......................... 102018201506.6

(51) Int. Cl.
| G01S 7/48 | (2006.01) |
| G01S 7/481 | (2006.01) |
| H01S 5/068 | (2006.01) |
| H01S 5/40 | (2006.01) |
| G01S 7/484 | (2006.01) |

(Continued)

(52) U.S. Cl.
CPC ............ *G01S 7/4817* (2013.01); *G01S 7/484* (2013.01); *G01S 7/4861* (2013.01); *G01S 17/10* (2013.01); *H01S 5/0612* (2013.01); *H01S 5/06804* (2013.01); *H01S 5/06817* (2013.01); *H01S 5/06837* (2013.01); *H01S 5/4043* (2013.01); *H01S 5/02415* (2013.01); *H01S 5/02469* (2013.01); *H01S 5/0617* (2013.01)

(58) Field of Classification Search
CPC .......... G01S 17/02; G01S 17/04; G01S 17/06; G01S 17/10; G01S 7/48; H01S 5/06; H01S 5/024; H01S 5/404; H01S 3/04
USPC ............................................... 250/205, 214 R
See application file for complete search history.

(56) References Cited

U.S. PATENT DOCUMENTS 7,482,610 B2 * 1/2009 Celanovic .............. H05B 3/009
250/493.1

FOREIGN PATENT DOCUMENTS

DE 102006052770 A1 5/2008
DE 112011100812 T5 3/2013
(Continued)

*Primary Examiner* — Que Tan Le
(74) *Attorney, Agent, or Firm* — Norton Rose Fulbright US LLP; Gerard Messina

(57) ABSTRACT

A transmitting unit of a LIDAR device includes at least two radiation sources for generating and emitting punctiform or linear electromagnetic beams into a scanning range, at least one of the radiation sources including an operating temperature settable as a function of an emission angle of the electromagnetic beams generated by the at least one radiation source. The different operating temperatures can generate beams having angle-dependent emission wavelengths, which can result in an improvement of the signal-to-noise ratio of a LIDAR device.

11 Claims, 3 Drawing Sheets

(51) Int. Cl.
*G01S 7/4861* (2020.01)
*G01S 17/10* (2020.01)
*H01S 5/06* (2006.01)
*H01S 5/0683* (2006.01)
*H01S 5/024* (2006.01)

(56) References Cited

FOREIGN PATENT DOCUMENTS

| DE | 102013002683 A1 | 8/2014 |
| DE | 102014211073 A1 | 12/2015 |
| DE | 102016108437 A1 | 11/2016 |
| DE | 102016213446 A1 | 1/2018 |

* cited by examiner

TRANSMITTING UNIT AND LIDAR DEVICE USING AT LEAST TWO RADIATION SOURCES HAVING AT LEAST ONE OF A SETTABLE OPERATING TEMPERATURE AND A SETTABLE EMISSION WAVELENGTH TO GENERATE AND EMIT PUNCTIFORM OR LINEAR ELECTROMAGNETIC BEAMS FOR SCANNING A SCANNING RANGE

CROSS-REFERENCE TO RELATED APPLICATIONS

The present application claims priority under 35 U.S.C. § 119 to DE 10 2018 201 506.6, filed in the Federal Republic of Germany on Feb. 1, 2018, the content of which is hereby incorporated by reference herein in its entirety.

FIELD OF THE INVENTION

The present invention relates to a transmitting unit of a LIDAR device including at least two radiation sources for generating and emitting punctiform or linear electromagnetic beams in a scanning range and to a LIDAR device for scanning a scanning range, which is defined by a vertical and a horizontal scanning angle, using electromagnetic beams.

BACKGROUND

Light Detection And Ranging (LIDAR) devices typically include a transmitting unit and a receiving unit. The transmitting unit generates and emits electromagnetic beams. A scanning range can be irradiated and scanned using the emitted beams. If these beams are incident on a moving or stationary object, the beams are reflected from the object in the direction of the receiving unit. The receiving unit can detect the reflected electromagnetic radiation and associate a receiving time with the reflected beams. This can be used, for example, within the scope of a "time-of-flight" analysis for an ascertainment of a distance of the object from the LIDAR device.

To optimize the signal-to-noise ratio, optical bandpass filters, for example, interference filters, can be situated in the receiving path of the LIDAR device to block interfering reflections. The narrower the transmitted wavelength range of the filter is, the less interfering or ambient light is incident on the detector and the better is the signal quality. However, in the case of the detection of beams having an angle of incidence greater than 0° in relation to an optical axis of the LIDAR device, a shift of the transmitted wavelength range of the bandpass filter toward shorter wavelengths occurs. Therefore, bandpass filters having a broader transmitted wavelength range are to be used so that beams having angles of incidence deviating from an optical axis can also be transmitted through the bandpass filter. However, a filter having a broader transmitted wavelength range can negatively affect the signal-to-noise ratio.

SUMMARY

Example embodiments of the present invention provide a method and a LIDAR device that enable a use of a filter having a smaller transmitted wavelength range and have an improved signal-to-noise ratio.

According to an example embodiment of the present invention, a transmitting unit of a LIDAR device includes at least two radiation sources for generating and emitting punctiform or linear electromagnetic beams in a scanning range. At least one radiation source has a settable operating temperature and/or a settable emission wavelength as a function of an emission angle of the electromagnetic beams generated by the at least one radiation source. The different operating temperatures generate, for example, angle-dependent emission wavelengths of the radiation sources, which can result in an improvement of the signal-to-noise ratio of a LIDAR system.

For example, semiconductor lasers can be used as the radiation source. The wavelength of the generated laser radiation or electromagnetic beams is dependent on the temperature of the semiconductor laser.

Unstabilized semiconductor lasers, for example, Fabry-Perot lasers, have a relatively large temperature dependence. The temperature dependence of the wavelength of the generated beams can be 0.3 nm/K in the case of a base wavelength of 905 nm and a use of gallium arsenide technology.

Semiconductor lasers having a monolithic integrated frequency stabilization, for example, DFB lasers, DBR lasers, VCSEL, VeCSEL, and the like can have a temperature-dependent wavelength dependence of 0.07 nm/K.

By operation of multiple radiation sources at different and defined operating temperatures, the individual emitters or radiation sources can generate and emit electromagnetic beams having defined wavelengths. In particular, the individual radiation sources can be thermally set in such a way that the generated beams have wavelengths adapted to a bandpass filter used. In this way, the generated beams can be adapted as a function of their emission angle to an angle-dependent shift of the transmission range of the bandpass filter of the LIDAR device. The transmission range or the filter bandwidth can be less than 25 nm, for example. The transmitting unit can preferably have a vertical scanning range of greater than +/−1°.

In particular, the filter bandwidth of the LIDAR device can be significantly reduced by the transmitting unit according to the present invention, whereby the signal-to-noise ratio is improved. In addition, such a LIDAR device can be manufactured cost-effectively.

The radiation sources of the transmitting unit can generate punctiform or planar and/or linear beams. The generated beams can be spaced apart from one another or include overlaps at least in regions. In particular, a homogeneous line for scanning a scanning range can be implemented by overlaps between differently generated beams.

According to an example embodiment, the operating temperature of at least one radiation source is passively settable by emitting operating heat to the surroundings or to a passive cooling body. In the case of passive setting of the temperature of the radiation sources, the intrinsic heating by the laser operation itself can be used to achieve different operating temperatures. This can be implemented, for example, by stacking of laser chips and/or the emitters, by a variation of the pump current, or by the implementation of different thermal resistances of the emitters at a shared heatsink. The radiation sources, for example, can be situated exposed or can be equipped with passive cooling bodies, whereby a defined heat emission and temperature control of the particular radiation sources is possible. In this way, the transmitting unit can be designed to be particularly technically simple.

According to an example embodiment, the operating temperature of at least one radiation source is actively settable by outputting operating heat to an active cooling element and/or by an active heating element. The operating temperature of the different radiation sources or emitters can be controlled, for example, by at least one heating element or at least one Peltier element in combination with a temperature control.

According to an example embodiment, the operating temperature is controllable as a function of an emission angle of the at least one radiation source. The particular wavelength of the generated beams can be specifically controlled in defined solid angles by an emission of the generated beams in different emission angles. The selection of the wavelengths is carried out in accordance with the optical bandpass filter used in the LIDAR device or in the receiving unit, in such a way that the wavelengths of the emitted beams match with the shift which the bandpass filter experiences due to the large angle of incidence of the reflected beams corresponding to the generated beams.

According to an example embodiment of the transmitting unit, the operating temperature of the at least one radiation source decreases with increasing emission angle. The generated beams are preferably generated at different wavelengths by the radiation sources, so that a filter installed in the detector path of the receiving unit or the LIDAR device can be passed with the least possible loss by the reflected beams. Beams having larger emission angles are to have a lower wavelength than beams which are emitted at small emission angles from the transmitting unit.

According to an example embodiment, the transmitting unit includes at least one optical element situated in the beam path of the emitted electromagnetic beams. The at least one optical element can be, for example, a generating optical unit of the transmitting unit. For example, the generating optical unit can be a coated or uncoated cylinder lens, convex lens, concave lens, or a combination of multiple identical or different lenses. The generated beams can be bundled or fanned out and/or changed in their divergence by the generating optical unit. For example, the beams are collimated if at least one lens is positioned at a distance of the focal length from the emitter surface.

In particular, a distance between the radiation sources or a beam offset can be converted into an angle deflection of the emitted beams by the generating optical unit. The emission angle of the generated beams can be changed as a function of the position of the emitters by the beamforming of the generating optical unit or the at least one optical element.

The emission angle caused by the generating optical unit is dependent in particular on the optical properties of the generating optical unit and the distance from the optical axis. Beams formed in this way can subsequently be emitted directly or via a deflection unit from the LIDAR device into the scanning range. The beams can preferably be deflected in a meandering shape along a horizontal angle and a vertical angle. The scanning range which is spanned by the horizontal angle and the vertical angle can thus be scanned using the generated and formed beams.

According to an example embodiment of the transmitting unit, the electromagnetic beams can be generated simultaneously or in succession by the at least two radiation sources. Therefore, individual points can be emitted simultaneously or sequentially. Alternatively, exposed areas or a continuous line can be emitted using generated beams. The activation of the individual emitters or the at least two radiation sources can be carried out simultaneously, as a so-called "line flash," sequentially, or in another defined sequence.

According to an example embodiment, the at least two radiation sources are surface emitters or edge emitters situated stacked or adjacent to one another. In this way, the at least two radiation sources can be situated in a space-saving and cost-effective manner in the transmitting unit.

According to an example embodiment of the present invention, a LIDAR device is provided for scanning a scanning range defined by a vertical and a horizontal scanning angle using electromagnetic beams. The LIDAR device includes at least one transmitting unit as described for generating electromagnetic beams and for distributing or deflecting the electromagnetic beams at least along the vertical scanning angle. Furthermore, the device includes at least one receiving unit for receiving beams reflected from at least one object situated in the scanning range, a bandpass filter for absorbing or reflecting interfering reflections, and at least one analysis unit for analyzing the received reflected beams, e.g., for ascertaining an object distance.

The beams generated by the transmitting unit, which are generated at a distance to an optical axis of the generating optical unit, have an emission angle after passing a generating optical unit. The emission angle is dependent in particular on the optical properties of the generating optical unit and the distance from the optical axis. Beams formed in this way can subsequently be emitted directly or via a deflection unit from the LIDAR device into the scanning range. The beams can preferably be deflected in a meandering shape along a horizontal angle and a vertical angle. The scanning range which is spanned by the horizontal angle and the vertical angle can be scanned using the generated and formed beams in this way.

If an object is situated in the scanning range, the formed and emitted beams are reflected on that object. At least one beam reflected on the object also has a greater reflection angle in this case. The at least one reflected beam can be received and detected by the receiving unit. For this purpose, the receiving unit preferably has a receiving optical unit, which deflects the at least one reflected beam onto a detector. In addition, an optical bandpass filter is situated in the receiving path. The filter can be situated, for example, upstream from the receiving optical unit, inside the receiving optical unit, or downstream from the receiving optical unit, proceeding from the incoming reflected beam. The filter is typically an interference filter, which includes a transmission for beams of a certain wavelength range. The transmitted wavelength range of the filter shifts as a function of an angle of incidence of the reflected beams on the filter. In particular, the transmitted wavelengths of the filter become smaller with increasing angle of incidence of a reflected incoming beam. Incoming beams having a wavelength outside the transmitted wavelength range can be reflected from the LIDAR device by the filter or absorbed by the filter.

In the LIDAR device according to the present invention, the wavelength of at least one generated beam or formed beam is settable as a function of its emission angle by passing the generating optical unit. The selection of the wavelengths is carried out according to the optical bandpass filter used in the receiving path of the LIDAR device. The wavelength of at least one generated or formed beam is preferably settable in such a way that the wavelength corresponds to the wavelength shift of the transmitted wavelength range of the optical bandpass filter after a reflection of the beam on an object. At least one generated beam spaced apart from the optical axis of the generating optical unit can have, for example, a shorter wavelength and therefore, in spite of a greater angle of incidence resulting therefrom on the optical bandpass filter, can be within the transmitted wavelength range and can preferably be transmitted without loss through the filter. In this way, in particular the transmitted wavelength range can be implemented as smaller, so that fewer interfering reflections pass the filter and can be registered by the detector. Multiple reflections of the surroundings, which are incident from different angles on the receiving unit and the filter, can also be blocked more effectively by an optical bandpass filter having smaller transmitted wavelength range. A reduced probability of the LIDAR device detecting "ghost objects" also results therefrom. Furthermore, the signal-to-noise ratio of the LIDAR device can be improved by a smaller transmitted wavelength range of the filter. Alternatively or additionally, generated beams having larger emission angles can also be used to enable a larger scanning range.

According to an example embodiment, the LIDAR device includes at least one temperature sensor for ascertaining an operating temperature of at least one radiation source of the transmitting unit and is connected to a control unit for actively setting an operating temperature of the at least one radiation source by way of at least one active cooling element and/or one active heating element. The operating temperature of the various radiation sources can be directly or indirectly measured and actively controlled by the control unit. The control of the operating temperature can be carried out by applying heat energy to the radiation sources or by actively withdrawing heat energy. Alternatively, the operating temperature can be adapted by an adaptation of an operating power of the at least one radiation source. In this way, the at least one radiation source can generate electromagnetic beams having a wavelength adapted to a bandpass filter.

Preferred example embodiments of the present invention will be explained in greater detail hereafter on the basis of highly simplified schematic views of the figures in which the same constructive elements each have the same reference numerals.

DETAILED DESCRIPTION

Figure 1:
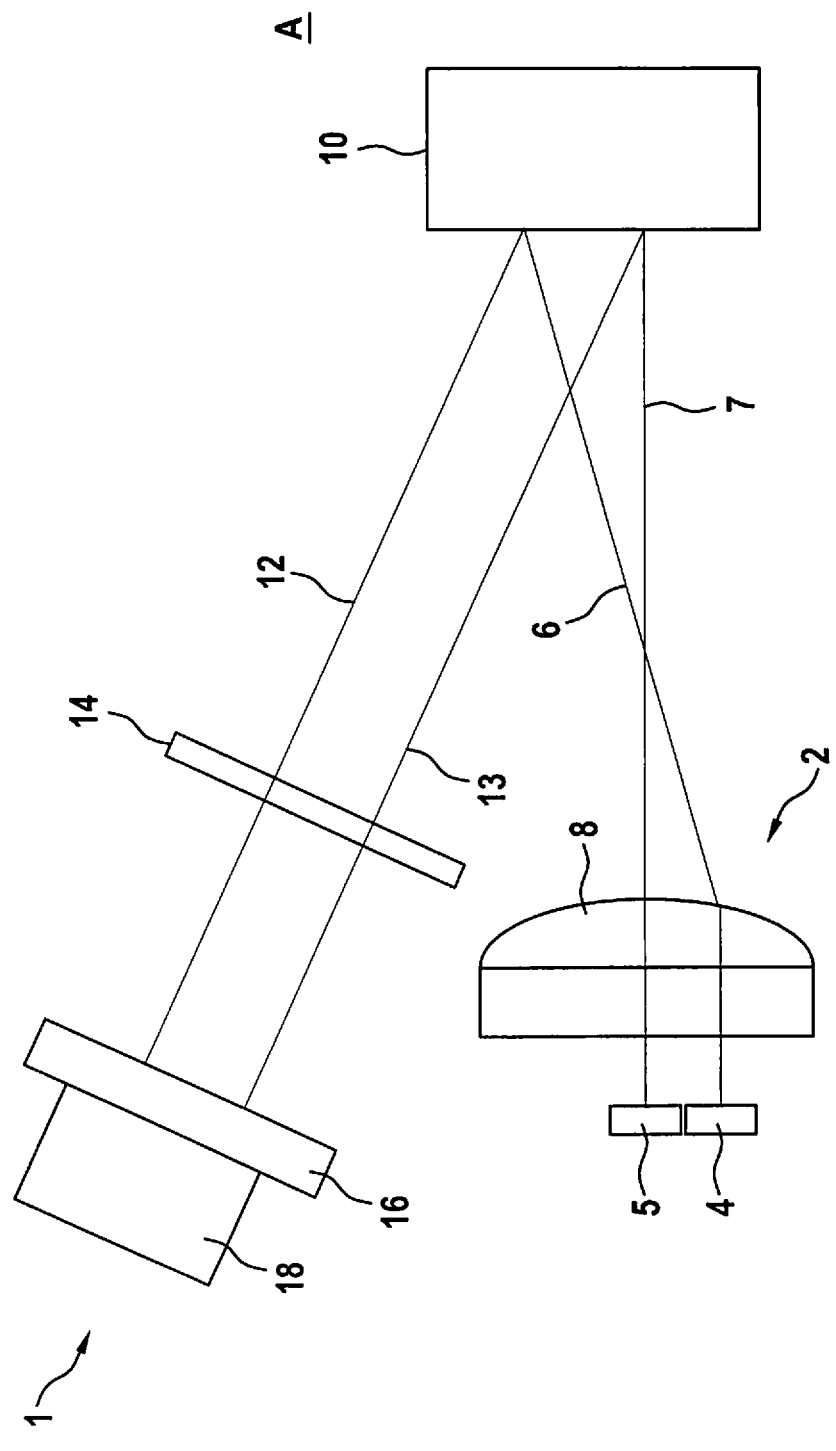
FIG. 1 shows a schematic view of a LIDAR device according to an example embodiment of the present invention.

FIG. 1 shows a schematic view of a LIDAR device 1 according to an example embodiment. Device 1 includes a transmitting unit 2 made up of multiple emitters or radiation sources 4, 5. Beams 6, 7, which are generated and emitted by radiation sources 4, 5, can be changed in their divergence by an optical element 8 connected downstream. According to the example embodiment, beams 6, 7 are bundled. Due to spacing of a radiation source 4 apart from the optical axis of optical element 8, correspondingly formed beams 6 have an emission angle which deviates from 0°. Due to the beam-forming, the emission angle of generated beams 6 thus changes as a function of a position of the emitters or radiation sources 4, 5.

Generated beams 6, 7 are emitted in a scanning range A and can be incident on an object 10. Generated beams 6, 7 can be at least partially reflected on object 10 and thus become reflected beams 12, 13.

Reflected beams 12, 13 are subsequently filtered by an optical bandpass filter 14 and can subsequently be detected by receiving unit 16 and analyzed by analysis unit 18.

Reflected beams 13 of first radiation source 5 are incident in this case at an emission angle of 0° on bandpass filter 14 and can be transmitted unobstructed through it.

Beams 6 emitted at an emission angle of greater or less than 0° and corresponding reflected beams 12 are no longer incident perpendicularly on bandpass filter 14. Bandpass filter 14 has a transmission range shifted toward shorter wavelengths. This relationship is illustrated by way of example in FIG. 4. The wavelength of generated beams 6 can be reduced in accordance with the emission angle by a thermal adaptation of radiation source 4, whereby reflected beams 12 can pass bandpass filter 14 unobstructed in spite of the shifted transmission range.

Figure 2:
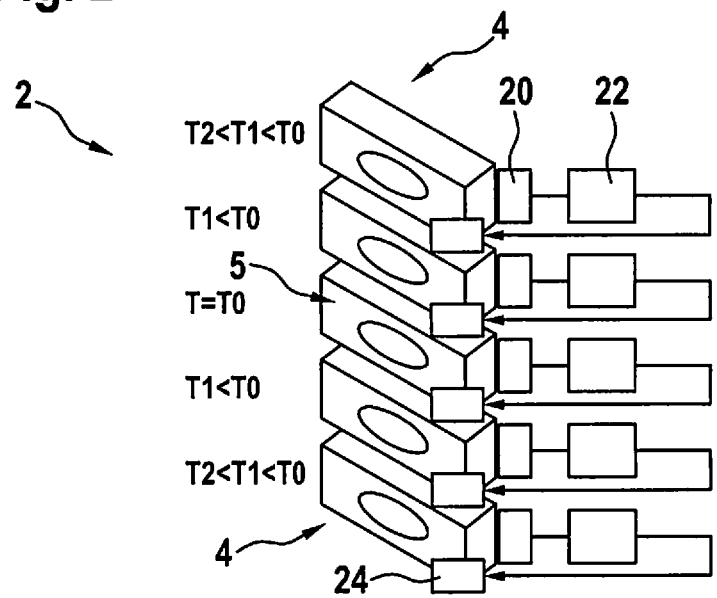
FIG. 2 shows a schematic view of a radiation source arrangement of a transmitting unit according to an example embodiment of the present invention.

FIG. 2 schematically illustrates a radiation source arrangement of a transmitting unit 2 according to an example embodiment. Radiation sources 4, 5 are semiconductor lasers according to the example embodiment. In this case, the operating temperature of radiation sources 4, 5 is actively controlled. For this purpose, transmitting unit 2 has a temperature sensor 20 on each radiation source 4, 5. All temperature sensors 20 are read out by a shared control unit or are each read out by a separate control unit 22.

Control unit 22 can activate Peltier elements 24, which are situated on radiation sources 4, 5, as heating or cooling elements to act on radiation sources 4, 5 based on the ascertained temperature of temperature sensors 20. Beams 7 along the optical axis of optical element 8 and/or generated by a centrally situated radiation source 5 have a reference temperature T0, which is adapted to bandpass filter 14. The farther additional radiation sources 4 are spaced apart from centrally situated radiation source 5, the lower their operating temperature T1, T2 is set in comparison to reference temperature T0. In this way, generated beams 6 are generated having a shortened wavelength in accordance with the emission angle and/or a shift of the transmission range of bandpass filter 14.

Figure 3:
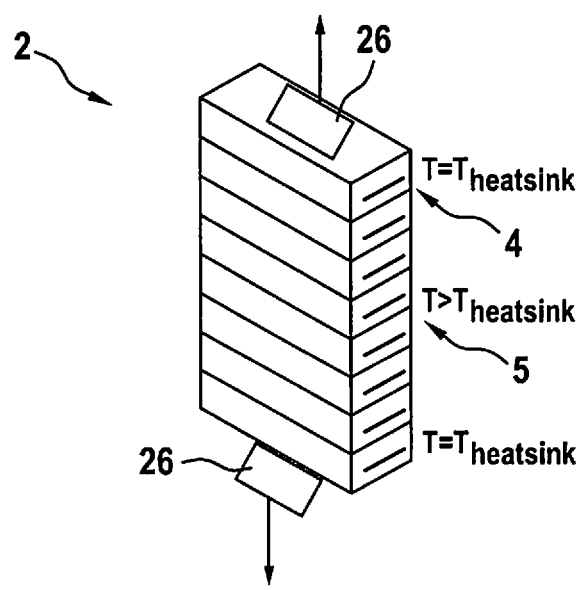
FIG. 3 shows a schematic view of a radiation source arrangement of a transmitting unit according to another example embodiment of the present invention.

FIG. 3 shows a schematic view of a radiation source arrangement of a transmitting unit 2 according to another example embodiment. In contrast to the previous example embodiment, radiation sources 4, 5 are connected to one another to form a stack. Radiation sources 4, 5 are coupled in a thermally conductive manner in this case. The two radiation sources 4 situated on an outer edge of the stack are each connected in a thermally conductive manner to a passive or active cooling body 26. In this way, a heat output illustrated according to the arrows results, which generates two temperature gradients. Emitter or radiation source 5 situated in the middle of the stack has the highest operating temperature. The temperature of radiation sources 4 drops toward the outer edges due to cooling body 26. In this way, beams 6, 7 adapted to the wavelength shift shown by way of example in FIG. 4 can be implemented by thermally set radiation sources 4, 5. The temperature gradient can be varied or influenced in this case by additional thermal resistors situated between radiation sources 4, 5.

Figure 4:
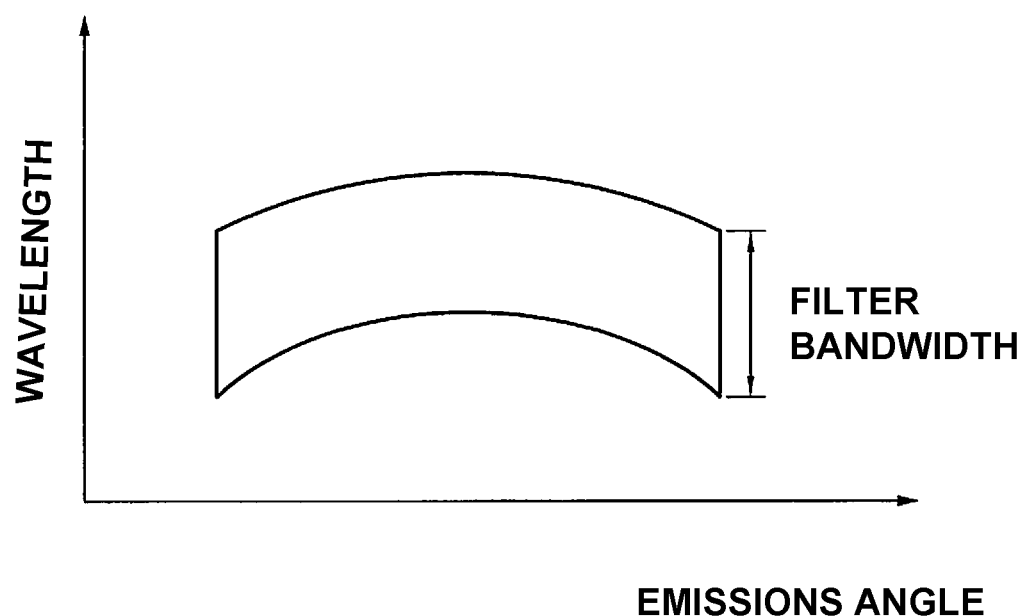
FIG. 4 shows a schematic view of a dependence of the transmitted wavelength of a bandpass filter on an emission angle of the incoming beams.

FIG. 4 shows a schematic view of a dependence of the transmitted wavelength of a bandpass filter 14 on an emission angle of incoming beams 12, 13.

What is claimed is:

1. A transmitting unit of a LIDAR device, the transmitting unit comprising:
at least two radiation sources configured to generate and emit punctiform or linear electromagnetic beams in a scanning range, wherein at least one of the radiation sources has at least one of an operating temperature and an emission wavelength that is settable as a function of an emission angle of the electromagnetic beams generated by the at least one radiation source.

2. The transmitting unit of claim 1, wherein the operating temperature of the at least one radiation source is settable by outputting operating heat to surroundings or to an active or passive cooling body.

3. The transmitting unit of claim 1, wherein the operating temperature of the at least one radiation source is settable at least one of by an active heating element and by outputting operating heat to at least one of an active cooling element.

4. The transmitting unit of claim 1, wherein the operating temperature of the at least one radiation source is controllable as a function of an emission angle of the at least one radiation source.

5. The transmitting unit of claim 4, wherein the at least one radiation source is provided such that the operating temperature of the at least one radiation source decreases when the emission angle increases.

6. The transmitting unit of claim 1, further comprising at least one optical element situated to be in a beam path of the emitted electromagnetic beams.

7. The transmitting unit of claim 1, wherein the at least two radiation sources are configured to generate the electromagnetic beams simultaneously.

8. The transmitting unit of claim 1, wherein the at least two radiation sources are configured to generate the electromagnetic beams in succession.

9. The transmitting unit of claim 1, wherein the at least two radiation sources are surface emitters or edge emitters situated stacked or adjacent to one another.

10. A LIDAR device for scanning a scanning range defined by a vertical and a horizontal scanning angle using electromagnetic beams, the LIDAR device comprising:
at least one transmitting unit that:
includes at least two radiation sources configured to generate and emit punctiform or linear electromagnetic beams in a scanning range, wherein at least one of the radiation sources has at least one of an operating temperature and an emission wavelength that is settable as a function of an emission angle of the electromagnetic beams generated by the at least one radiation source; and
is configured to distribute or deflect the electromagnetic beams at least along the vertical scanning angle;
at least one receiving unit for receiving beams reflected on at least one object situated in the scanning range;
a bandpass filter for absorbing or reflecting interfering reflections; and
an analysis unit, wherein the analysis unit is configured to analyze the received reflected beams.

11. The LIDAR device of claim 10, further comprising at least one temperature sensor that is configured to ascertain the operating temperature of the at least one radiation source and that is connected to a control unit for actively setting the operating temperature of the at least one radiation source using at least one of an active cooling element and (b) an active heating element.

* * * * *